United States Patent [19]

Lee et al.

[11] Patent Number: 4,943,804
[45] Date of Patent: * Jul. 24, 1990

[54] ELECTRONIC KEY LOCKING CIRCUITRY

[75] Inventors: Robert D. Lee, Denton; Donald R. Dias, Carrollton, both of Tex.

[73] Assignee: Dallas Semiconductor Corporation, Dallas, Tex.

[*] Notice: The portion of the term of this patent subsequent to Sep. 26, 2006 has been disclaimed.

[21] Appl. No.: 412,767

[22] Filed: Sep. 26, 1989

Related U.S. Application Data

[63] Continuation of Ser. No. 163,281, Mar. 2, 1988, Pat. No. 4,870,401.

[51] Int. Cl.$^5$ .................. H04Q 1/00; H01H 47/00
[52] U.S. Cl. .................. 340/825.310; 340/825.34; 361/172
[58] Field of Search ........... 340/825.3, 825.31, 825.32, 340/825.34, 825.83, 825.84, 825.69, 825.72; 361/172; 235/380, 382, 382.5; 70/277, 278, 256, 257, 383, 465; 365/96; 307/10.3

[56] References Cited

U.S. PATENT DOCUMENTS

| | | | |
|---|---|---|---|
| 4,385,368 | 5/1983 | Principi et al. | 365/96 |
| 4,509,093 | 4/1985 | Stellberger | 340/825.31 |
| 4,594,637 | 6/1986 | Falk | 361/172 |
| 4,672,379 | 6/1989 | Lewmer et al. | 361/172 |
| 4,870,401 | 9/1989 | Lee et al. | 340/825.31 |

*Primary Examiner*—Donald J. Yusko
*Assistant Examiner*—Eric O. Pudpud
*Attorney, Agent, or Firm*—Worsham, Forsythe, Sampels & Wooldridge

[57] ABSTRACT

An electronic key which responds to different sets of valid commands over its lifetime, depending on the state of certain circuits within the electronic key.

(1) After initial fabrication of the electronic key, the electronic key recognizes a first set of valid commands and ignores all other commands.

(2) After the electronic key is tested and a countdown circuit within the electronic key has been calibrated, a fusing element inside the electronic key is blown. This reduces the number of valid commands recognizable by the electronic key. Thus, the key is now restricted to a second set of valid commands.

(3) The electronic key is then shipped to an OEM, who programs data into the key and also programs the length of time of the countdown timer. The OEM then sets an R-S flip-flop in the electronic key, which causes certain of the second set of commands to be ignored. Thus, the key will now respond only to a third set of valid commands.

(4) The electronic key is then shipped to an end user. The first valid command recognized by the electronic key, after the R-S flip-flop has been set, starts the countdown timer.

(5) After the countdown timer has timed out, the number of valid commands is further reduced. Thus, the key will now respond only to a fourth (very small) set of valid commands.

5 Claims, 3 Drawing Sheets

ELECTRONIC KEY LOCKING CIRCUITRY

This is a continuation of application Ser. No. 163,281, filed 3/2/88, now U.S. Pat. No. 4,870,401.

REFERENCE TO OTHER APPLICATIONS

Reference is made to the following application and patents, owned by the assignee of the present application: Ser. No. 163,082, Filed 3/2/88 (2846-16), entitled FUSING AND DETECTION CIRCUIT; Ser. No. 163,279, Filed 3/2/88 (2846-17), entitled PROGRAMMABLE TIME BASE CIRCUIT WITH PROTECTED INTERNAL CALIBRATION, now issued as U.S. Pat. No. 4,897,860; Parent application Ser. No. 163,281, Filed 3/2/88 (2846-18), entitled ELECTRONIC KEY LOCKING CIRCUITRY, now issued as U.S. Pat. No. 4,870,401; Ser. No. 163,280, Filed 3/2/88 (2846-19), entitled ESD RESISTANT LATCH CIRCUIT; and also to commonly owned U.S. Pat. No. 4,810,975(2846-13), entitled RANDOM NUMBER GENERATOR USING SAMPLED OUTPUT OF VARIABLE FREQUENCY OSCILLATOR.

TECHNICAL FIELD

This invention relates to electronic keys, and more particularly, to locking circuitry for electronic keys.

BACKGROUND OF THE INVENTION

Electronic keys are used primarily to provide access to secure electronic data upon receipt of a valid password and to prohibit such access if an invalid password is received. One such application is the use of an electronic key hardware module in conjunction with commercially available software. The electronic key module is attached to the computer operating the software in a manner to allow the software to access the electronic key, and the software is programmed with an algorithm to verify that the module is attached to the computer. Thus, while the software is easily copied, the electronic key hardware module is not; and the software cannot, therefore, be simultaneously used in several computers.

In a basic electronic key used with software, the software interrogates the key and verifies that the secure data matches data in the software. In more advanced forms of the electronic key, the electronic key allows data to be written into a random access memory inside the key and later read from the key, thus making an unauthorized duplication of the key or software to mimic the key more difficult.

It can be appreciated that other enhancements to electronic keys that add additional features to make the key more versatile and/or to enhance the security are advantageous and desirable for the customer of the electronic key manufacturer and, therefore, for the manufacturer itself.

SUMMARY OF THE INVENTION

It is, therefore, an object of the present invention to provide an electronic key which has an additional function which limits the full operational life of the electronic key to a predetermined time interval or a predetermined number of cycles of operation.

It is also an object of this invention to provide an electronic key which has a fuse element to provide additional security in protecting at least some of the stored data.

Shown in an illustrated embodiment of the invention is an electronic key which recognizes as a valid command a command to perform at least one operation of a first plurality of operations if a timing circuit inside the electronic key has not detected that a predetermined time interval has lapsed. The electronic key recognizes as a valid command a command to perform at least one operation of a second plurality of operations if the timing circuit within the electronic key has detected that the predetermined time interval has lapsed.

Also shown in an illustrated embodiment of the invention is an electronic key which recognizes as a valid command a command to perform at least one operation of a first plurality of operations if a counting circuit inside the electronic key has not detected that the electronic key has undergone a predetermined number of particular operations. The electronic key recognizes as a valid command a command to perform at least one operation of a second plurality of operations if the counting circuit within the electronic key has detected that the electronic key has undergone a predetermined number of the particular operations.

Also shown in an illustrated embodiment of the invention is an electronic key containing a fuse element which, when unblown, permits signals appearing at an input terminal to be transferred to storage registers in the electronic key, and after being blown, isolates the input terminal from the storage registers.

BRIEF DESCRIPTION OF THE DRAWINGS

The aforementioned and other features, characteristics, advantages, and the invention in general, will be better understood from the following, more detailed description taken in conjunction with the accompanying drawings in which.

Figure 1:
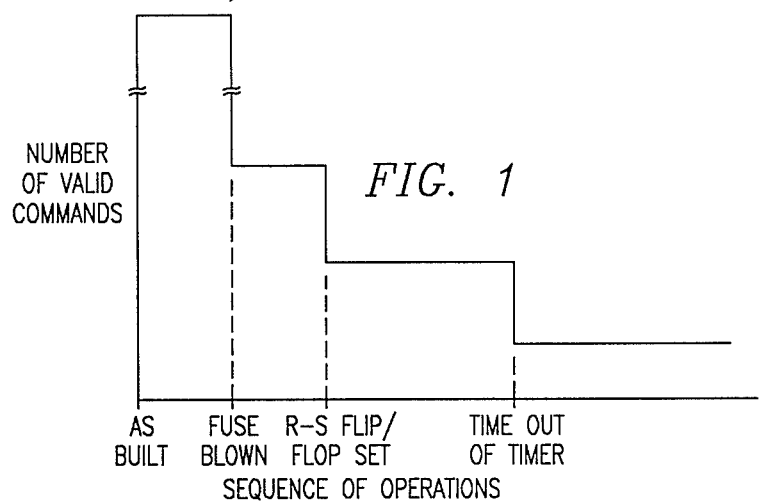
FIG. 1 is a plot of the relative number of valid commands recognized in the preferred embodiment of an electronic key according to the present invention for various conditions of the electronic key.

It will be appreciated that for purposes of clarity and where deemed appropriate, reference numerals have been repeated in the figures to indicate corresponding features.

DESCRIPTION OF THE PREFERRED EMBODIMENTS

An electronic key according to a preferred embodiment of the present invention recognizes a first plurality or set of commands after initial fabrication as shown in FIG. 1. After the initial fabrication of the electronic key and after it has been attached to a battery and formed into a module, and after testing and calibration, a fuse is blown to reduce the number of valid commands recognized by the electronic key to a second plurality or second set of commands as shown in FIG. 1. Specifically, test and calibration commands are no longer recognized as valid commands by the electronic key after the fuse has been blown. When the electronic key is in this configuration, the key is next shipped to an original equipment manufacturer (OEM) who performs certain tests and programs certain data into the electronic key ring, including the number of days in which a timeout circuit will count down after it has been activated by an end user. The OEM then sends a lock oscillator command to the electronic key which sets an R-S flip-flop in the electronic key which further reduces the number of valid commands recognized by the electronic key to a third plurality or third set of commands. The OEM then issues an arm oscillator command which causes the electronic key to begin its internal timeout counter upon the first use of the electronic key by an end user.

The electronic key in this configuration is then shipped to an end user who can perform any of the third plurality of valid commands until the timeout counter completes its timeout cycle. Prior to the completion of the timeout cycle, the end user can read and write data from and to a secure memory inside the electronic key. When the timeout counter completes its timing cycle (when the time set by the OEM has expired) then the command set is further reduced to a fourth plurality or fourth set of commands which the electronic key ring will recognize. This fourth set of commands includes reading data from the secure memory but not writing data into the secure memory.

An example of the use of an electronic key according to the present invention would be for an OEM to ship the electronic key with its software which is provided to an end user on an evaluation basis. The software would be programmed to periodically write data to the electronic module and read data back and to cease its operation if the proper data is not read back from the electronic key. After the timeout cycle, the software would not be able to write data into the electronic key and therefore would detect an improper read when it tried to read data out of the electronic key. However, the ability to read data from the electronic key would permit the end user to send the electronic key back to the OEM who could read the data in the electronic key and provide the end user with another electronic key which had the proper data and would be compatible with the software held by the end user to allow the end user to continue to use the software with a new electronic key furnished by the OEM.

Figure 2:
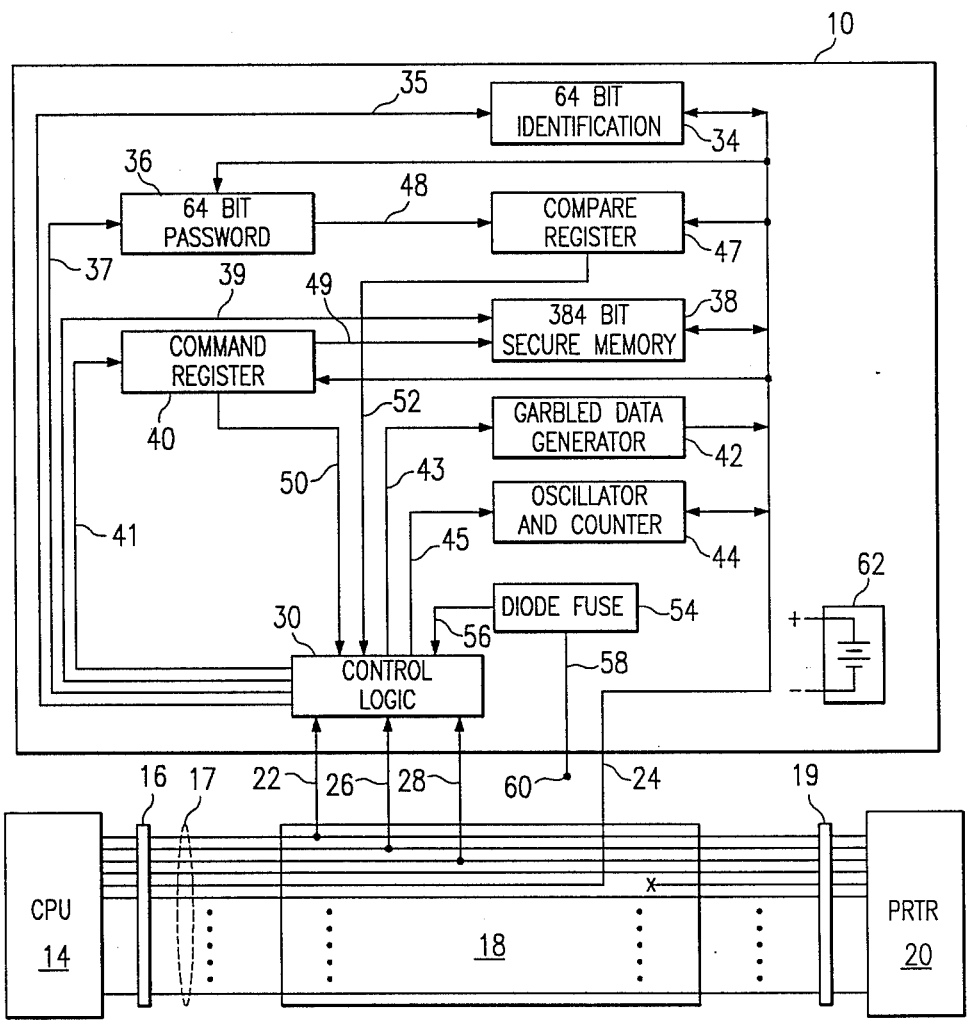
FIG. 2 is a functional block diagram of a preferred embodiment of an electronic key according to the present invention.

A block diagram of an electronic key system containing an electronic key 10 in accordance with the present invention is shown in FIG. 2. Also shown is a central processing unit (CPU) 14 which has connected to it a parallel port connecter 16 through which passes a plurality of data lines and other signal lines 17. Connected to the parallel port connecter 16 is an interface circuit or key ring 18. Connected to the output of the key ring 18 is another parallel port connecter 19 which in turn is shown connected to a printer 20. Connected between the key ring 18 and the electronic key 10 are four lines: a clock line 22, a data line 24, a reset line 26, and a ground line 28.

Three of the four lines, the clock line 22, the reset line 26 and the ground line 28, are connected to a control logic circuit 30 within the electronic key 10. The control logic circuit 30 has six outputs. The first output of the control logic circuit 30 is connected to the input of a 64 bit identification register 34 on a line 35; the second output is connected to the input of a 64 bit password register 36 on a line 37; the third output is connected to a first input of a 384 bit secure memory 38 on a line 39; the fourth output is connected to a first input of a command register 40 on a line 41; the fifth output is connected to the input of a garbled number generator 42 on a line 43; and the sixth output is connected to the input of an oscillator and counter circuit 44 on a line 45.

The data line 24 is connected to a bidirectional input/output terminal of the 64 bit identification register 34, to a second input of the 64 bit password register 36, to a first input of a compare register 47, to a bidirectional input/output terminal of the 384 bit secure memory 38, to a second input of the command register 40, to the output of a garbled data generator circuit 42, and to a bidirectional input/output terminal of the oscillator and counter circuit 44. The output of the 64 bit password register 36 appears on a line 48 which in turn is connected to a second input of the compare register 47. An output of the command register 40 appears on a line 49 which is connected to a second input of the 384 bit secure memory 38. Another output of the command register 40 appears on a line 50 which is connected to another input of the control logic circuit 30. The output of the compare register 44 appears on a line 52 which is connected to another input of the control logic circuit 30. The control logic 30 also has an input from a diode fuse circuit 54 on a line 56. The diode fuse circuit 54 has an input on a line 58 from a fuse input terminal 60 of the electronic key 10. The fuse input terminal 60 is not connected to the key ring 18, the fuse input terminal 60 being used only by the manufacturer of the electronic key 10 in the manner described in detail below.

It will be understood that the lines 35, 37, 39, 41, 45, 49, and 50 may carry multiple signals and may be multiple conductor lines rather than being single connections.

The circuitry described above as being included within the electronic key 10 is embodied in a CMOS integrated circuit in the preferred embodiments. The electronic key 10 also includes a back-up battery 62 which is connected to the CMOS integrated circuit and which provides back-up power for the CMOS integrated circuit, and power for the oscillator in the oscillator and counter circuit 44. In the preferred embodiments the CMOS integrated circuit and back-up battery are contained within a molded plastic package to form a portable module having connector pins for making the connections with the key ring 18 that are described above.

In the preferred embodiment, the data lines and other signals contained within the parallel port connector 16 out of the CPU 14 are passed directly to the printer 20 with the exception of the SLCTIN signal in the parallel port connector 16 which is used to provide data to and from the electronic key 10 on line 24. Since the SLCTIN signal is generally not used by peripheral printers, the key ring 18 directs this SLCTIN signal directly to line 24 leading into the electronic key 10 and disconnects the SLCTIN signal line from the peripheral device 20.

The other three lines, the clock line 22, the reset signal 26 and the ground line 28, are tapped off lines which are connected between the CPU 14 and the printer 20. The clock line 22 in the preferred embodiment is tapped off the line commonly known in the computer industry as the data out 3 (D3) line, and the reset line 26 is tapped off the line commonly known as the data out 2 (D2) line. The ground line 28 is the standard ground line in the parallel port connector 16.

Although not shown in FIG. 2 nor discussed in detail for the sake of brevity, it will be understood that the electronic key ring 18 can be suitably modified by means known to those skilled in the art for use in virtually any communications path such as between the CPU 14 and a nonvolatile memory device, such as a ROM, inside of the CPU 14, or attached to an RS232 serial port. In at least some of these configurations, the electronic key ring 18 would contain additional switching and logic circuitry and would require an additional predetermined serial bit stream from the CPU 14 to signal the electronic key ring 18 to route certain signal lines to the electronic key 10 rather than through the normal communication channel.

With reference again to FIG. 2, each cycle of the electronic key 10 begins with a low-to-high transition on the reset line 26 followed by a 24 bit command word. The reset line 26 provides power to the electronic key 10 and must be held high during the entire transaction. Moreover, the voltage on the reset line 26 must be brought low between each transaction in order to reset the electronic key 10. During a write operation of data into the electronic key 10, the data is transferred into the electronic key 10 on the rising edge of the clock signal appearing on the clock line 22; and during a read operation of data out of the electronic key 10, the data is presented on the data line 24 of the electronic key 10 on the falling edge of the clock signal on the clock line 22 and remain present while clock is low. The control logic 30 receives the clock signal on the clock line 22 and synchronizes the circuitry within the electronic key 10 with this clock signal.

When the electronic key 10 receives a command which it does not recognize as a valid command, a signal is sent by the command register 40 to the control logic 30 on line 50 which causes the control logic 30 to lock up and the electronic key 10 then ignores all other data until it receives another low-to-high transition on the reset line 26.

After the electronic key 10 is initially fabricated, it will recognize a first plurality or set of valid commands which includes the nine commands described below together with testing commands used by the manufacturer to test the electronic key 10. This first set of valid commands also includes calibration commands for calibrating the oscillator and counter circuit 44 as described in the co-pending related application entitled PROGRAMMABLE TIME BASE CIRCUIT WITH PROTECTED INTERNAL CALIBRATION (2846-17), Ser. No. 163,279, Filed 3/2/88, in the name of Lee, Robert D. et al. and incorporated herein by reference.

After the electronic key 10 has been fabricated, tested, and calibrated, a fusing element in the diode fuse circuit 54 is blown, and this blown condition is transferred to the control logic 30 on line 56 which in turn is transferred to the command register 40 on line 41 which causes the command register 40 to ignore the testing and calibration commands which it recognized before the fuse was blown. Stated in another way, the testing and calibration commands which were recognized as valid commands before the fuse element in the diode fuse circuit 54 was blown are no longer recognized as valid commands. The diode fuse element in the diode fuse circuit 54 is blown by the application of the proper voltage at the fusing input terminal 60 of the electronic key 10. The diode fuse circuit 54 and its operation are described in detail in the co-pending application entitled FUSING AND DETECTION CIRCUIT, Ser. No. 163,082, Filed 3/2/88, in the name of Lee, Robert D. and is incorporated herein by reference.

After the fusing element in the diode fuse circuit 54 has been blown, the electronic key 10 is then shipped to an OEM. At this stage the electronic key 10 recognizes the following nine commands:

1. Read 20 bit counter command— upon receipt of this command, the electronic key 10 reads in sequence the logic state of the 20 bit counter in the oscillator and counter circuit 44 and places these logic states on the data line 24 upon the receipt of the next 20 clock cycles on the clock line 22.

2. Read 9 bit day counter command— upon receipt of this command, the electronic key 10 places the 9 bits in the 9 bit day counter located in the oscillator and counter circuit 44 onto the data line 24 upon receipt of the next nine clock cycles on the clock line 22.

3. Arm oscillator command— upon receipt of this command, the electronic key 10 sets a flag in the control logic 30. Upon receipt of the next valid command, the control logic 30 will set a signal on line 45 to the oscillator and counter circuit 44 to cause the oscillator to begin operating and to therefore begin the countdown of the countdown counter (consisting of the oscillator, 20 bit counter, and 9 bit counter).

4. Stop oscillator command— upon receipt of this command by the electronic key 10, the command register signals the control logic 30 which in turn signals the oscillator and counter circuit 44 to stop the oscillator and put the oscillator and counter circuit 44 in a low power mode in order that the electronic key 10 may be stored for long periods of time without appreciably draining power from the backup battery used to provide backup power to the electronic key 10.

5. Write 9 bit day counter command— upon receipt of this command, the electronic key 10 will transfer the next sequential 9 bits of data appearing on the data line 24 into the 9 bit counter in the oscillator and counter circuit 44 in synchronization with the next 9 clock pulses received on the clock line 22.

6. Lock counter command— upon receipt of this command, an R-S flip-flop circuit within the control logic 30 is set by circuitry described in detail in the co-pending application entitled ESD RESISTANT LATCH CIRCUIT, Ser. No. 163,280, filed 3/2/88, in the name of Dias, Donald R. and incorporated herein by reference. The status of this R-S flip-flop circuit is transferred on the line 41 to the command register 40 which, if the R-S flip-flop circuit has been set, causes the command register 40 to ignore any subsequent write 9 bit day counter and stop oscillator commands.

7. Write 64 bit identification/64 bit password command— upon receipt of this command, the electronic key 10 will transfer the next 64 bits of data on the data line 24 into the 64 bit identification register 34 and the following 64 bits on the data line 24 into the 64 bit password register 36 in synchronization with the clock signal appearing on the clock line 22.

8. Read 384 bit secure memory— upon receipt of this command, the electronic key 10 will first present the 64 bits in the 64 bit identification register 34 onto the data line 24 in synchronization with the clock signal on the clock line 22. The electronic key 10 then reads the next 64 bits presented on the data line 24 (the password) and compares the 64 bits with the data stored in the 64 bit password register 36 through the circuitry in the compare register 47. If the compare register 47 indicates that the proper 64 bit password has been received, then the control logic 30 causes the 384 bit secure memory 38 to place the 384 bits in the secure memory onto the data line 24 upon receipt of the next 384 clock signals on the clock line 22. If the 64 bit password sent to the electronic key 10 does not match the 64 bits stored in the 64 bit password register 36, the control logic 30 signals the garbled data generator 42 to place 384 bits of garbled data onto the data line 24. The garbled data generator 42 is described in the U.S. Pat. No. 4,810,975 (2846-13), entitled RANDOM NUMBER GENERATOR USING SAMPLED OUTPUT OF VARIABLE FREQUENCY OSCILLATOR, in the name of Dias, Donald R. and incorporated herein by reference.

9. Write 384 bit secure memory— upon receipt of this command, the electronic key 10 performs the same sequence of operations as in the read 384 bit secure memory command except that (a) upon receipt of the last 384 clock cycles, the data on the data line 24 is written into the 384 bit secure memory 38 and (b) upon receipt of an invalid password, the electronic key 10 will ignore all furthur clock signals until the signal on the reset line 26 is brought low and then high again to reset the electronic key 10.

Figure 3:
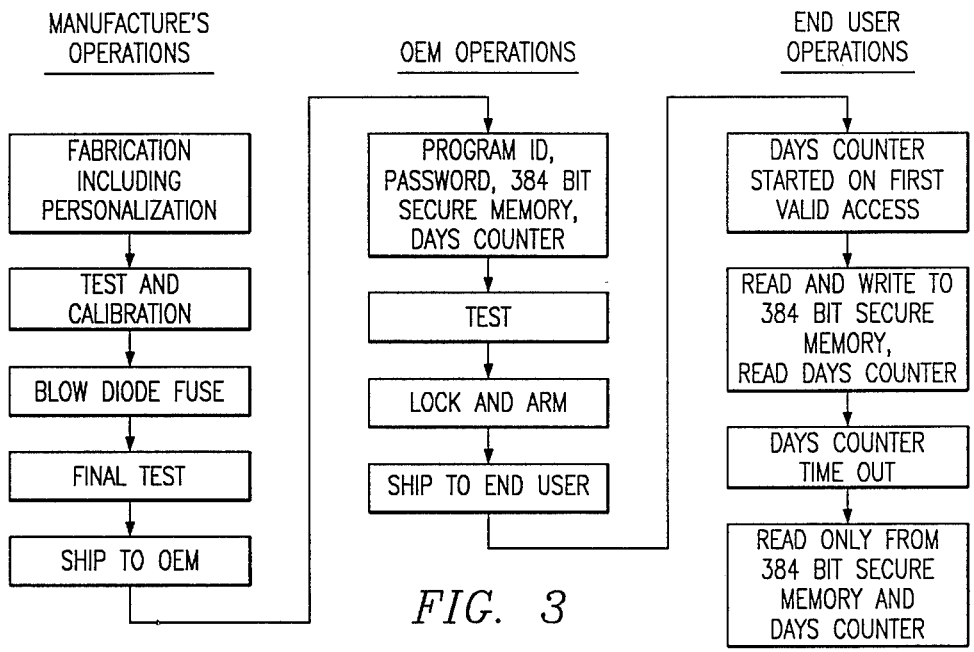
FIG. 3 is a flow chart of the manufacturing, OEM customization, and user operation of the preferred embodiment of an electronic key according to the present invention.
Figure 5:
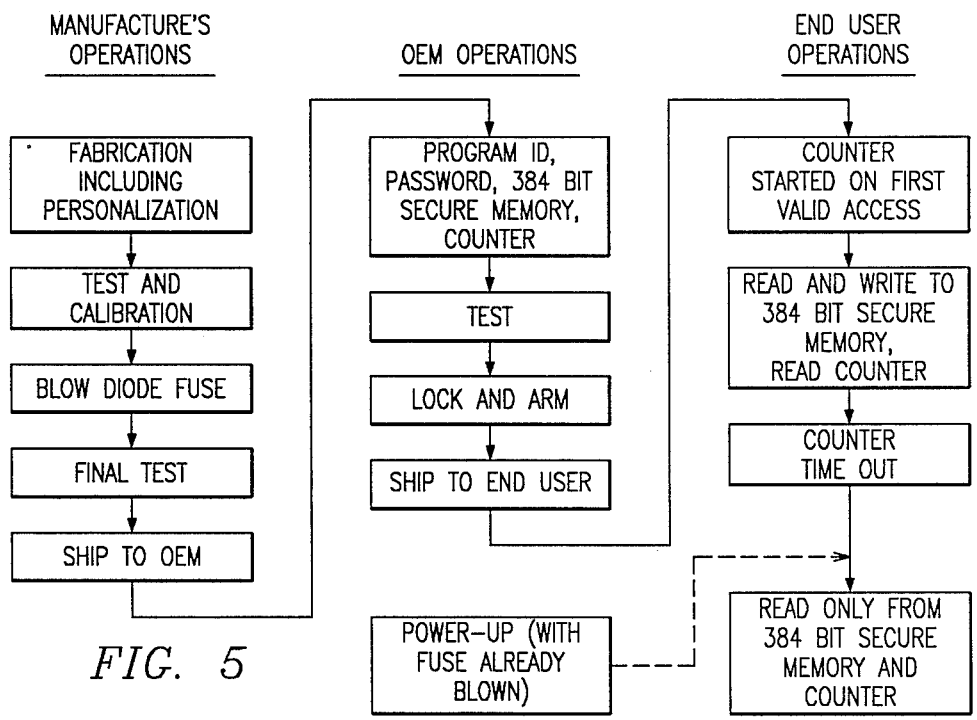
FIG. 5 is a flow chart of the manufacturer, OEM customization, and end user operation of an alternative embodiment of an electronic key according to the present invention.
Figure 4:
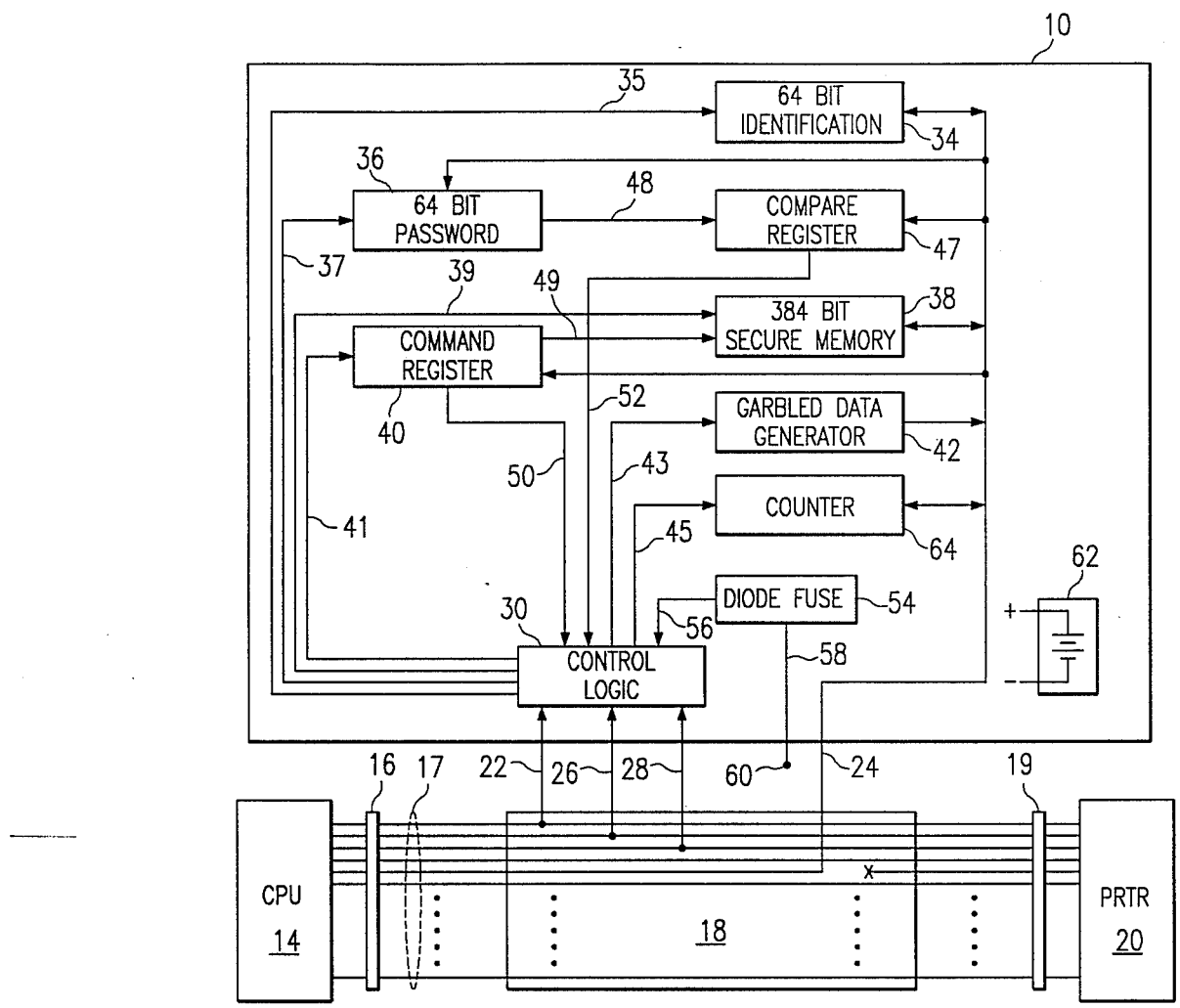
FIG. 4 is a functional block diagram of an alternative embodiment of an electronic key according to the present invention.

Turning now to FIG. 3, a flow chart is shown of the relevant sequence of operations of the electronic key 10, specifically the manufacturing operation, the OEM customization, and the end user operations. When the electronic key 10 is being fabricated by the manufacturer, a personalization code of 13 bits, which is unique to each OEM customer of the manufacturer, is hardware programmed into the electronic key 10 as 13 of the 24 bits required in each valid command recognized by the electronic key 10. After the electronic key 10 is manufactured, the integrated circuit is attached to a backup battery and formed into an electronic key module.

At this time, the electronic key 10 is tested by the manufacturer, which tests include special tests commands recognized as valid commands by the electronic key 10. In addition, the electronic key 10 recognizes certain calibration commands used to calibrate the oscillator as described in the above-referenced co-pending patent application entitled ON CHIP TIME BASE. After the electronic key has been tested and calibrated, the fusing element within the diode fuse circuit 54 is blown in a manner described in the above-referenced co-pending application entitled FUSING AND DETECTION CIRCUIT.

After the fusing element in the diode fuse circuit 54 has been blown, the set of valid commands recognized by the electronic key 10 is reduced to the nine commands listed above. In addition, the blown state of the fusing element causes the electronic key to lock up if the primary power on the reset line 26 and the power supplied by the backup battery 62 is interrupted. The lockup occurs because the 9 bit day counter in the oscillator and counter circuit 44 is biased to come up in the zero time state when power is applied to the counter, and the R-S flip-flop circuit is designed to come up in the set or locked state when power is applied. Thus, at this point in the sequence of operations, it is not possible to remove power from the electronic key 10 and reapply the power to reset the electronic key to a condition to recognize all of the valid commands available prior to the blowing of the fusing element or to a condition to recognize all of the valid commands available prior to the issuance of the lock command after the lock command has been sent to the electronic key 10.

After the fusing element is blown, the manufacturer performs a verification test and ships the electronic key 10 to the OEM whose personalization code has been hardware encoded into the electronic key 10 as described above.

The OEM then programs the identification bits in the 64 bit identification register 34, the password bits in the 64 bit password register 36, the 384 bit secure memory 38, and the 9 bit days counter in the oscillator and counter circuit 44. By using the arm oscillator command, the read 20 bit counter command, the read 9 bit day counter command, and the stop oscillator command, the OEM can verify that the countdown timer in the oscillator and counter circuit 44 is operating properly. After all of the above-mentioned bits have been properly programmed into the electronic key 10 and the oscillator has been stopped, the OEM issues a lock command. The effect of issuing this lock command is to set an R-S flip-flop circuit inside the control logic 30 which in turn operates to further reduce the command set which the electronic key 10 will recognize as valid commands. Specifically, after the R-S flip-flop circuit is set, the nine commands previously listed would now be recognized as valid commands with the exception of the write 9 bit day counter command and the stop oscillator command. The OEM would then issue an arm command so that the next valid command received by the electronic key 10 would start the oscillator and counter circuit 44.

When the OEM has completed his testing of the electronic key 10 and the electronic key 10 is ready for use by an end user, the oscillator and counter circuit 44 is in a low power mode configuration and thus the backup battery is able to provide backup power to the electronic key 10 for a relatively long period of time. Once the oscillator and counter circuit 44 have begun the timeout cycle, the power drawn by the oscillator and counter circuit 44 is appreciably greater than when the oscillator and counter circuit 44 is in a low power mode, and thus reduces somewhat the life of the backup battery. However, the power drain by the electronic key 10 when the timeout circuit is counting down is low enough to guarantee that the backup battery will provide adequate power for the electronic key 10 during the longest timeout cycle period.

After the end user has received the electronic key 10 and installed the electronic key 10 in his system, the first valid command recognized by the electronic key 10 will start the oscillator timeout period. Until the timeout circuit has completed the timeout cycle, the electronic key 10 will recognize the seven remaining valid commands.

After the timeout circuit has completed its cycle (i.e., has counted down to zero time remaining), the set of valid commands recognized by the electronic key 10 is further reduced to three valid commands in the preferred embodiment. These three valid commands are to read the 20 bit counter, to read the 9 bit day counter to verify that the counter has counted down to zero time, and to read the 384 bit secure memory. These last two commands allow the end user to verify that a timeout has occurred and allow the OEM to determine the appropriate data to program into another electronic key which, when sent to the end user, would allow the end user to resume using the software from the point when the timeout occured.

An alternative embodiment for an electronic key 10 according to the present invention is to replace the oscillator and counter circuit 44 with a down counter 64 which would be preprogrammed by the OEM in the same manner as the 9 bit day counter in the oscillator and counter circuit 44, and which would count down by one count for each valid command received by the electronic key 10 until the down counter 64 reaches the zero count state. The electronic key 10 would then operate in the same manner as when the oscillator and counter circuit 44 counted down to the zero time state. That is, when the down counter counted down to the zero count state, the electronic key 10 would recognize as valid commands only commands to read the state of the down counter 64 and to read the bits stored in the 384 bit secure memory 38.

In this alternative embodiment, there would not be calibration commands required nor commands to start the oscillator or stop the oscillator or a command to read the 20 bit counter. The only command required would be to write the down counter 64, which command would cease to be a valid command when the lock command is issued, and a command to read the state of the down counter 64. Alternatively, the down counter 64 could also be fabricated to count only certain of the valid commands received by the electronic key 10, for example, commands to read data from the 384 bit secure memory and to not count other valid commands received by the electronic key 10.

In a further alternative embodiment, a diode fuse circuit 54 could be replaced by an additional R-S flip-flop circuit. The reset state of this additional R-S flip-flop circuit would provide the same signal on line 56 as does the diode fuse circuit 54 prior to the time that the fusing element is blown, and the set status of the additional R-S flip-flop circuit would provide the same signal on line 56 as the diode fuse circuit 54 after the fusing element has been blown.

In this further alternative embodiment, the additional R-S flip-flop circuit can only be reset by the reapplication of battery voltage from the backup battery 62 after all power has been removed from the electronic key 10. This additional R-S flip-flop circuit powers up in the reset state due to capacitive biasing on the input terminals of the additional R-S flip-flop circuit.

At the place in the sequence of events listed above in which the fusing element in the diode fuse circuit 54 is blown, the additional R-S flip-flop circuit would be switched to the set condition in this further embodiment by the application of an appropriate command to the electronic key 10.

The advantage of this further alternative embodiment is that the fusing element is replaced by an additional R-S flip-flop circuit which is easier to fabricate and eliminates the problems associated with the blowing of the fusing element in the diode fuse circuit 54. The disadvantage is that the electronic key 10 then can be reset by an end user by the disconnection of the backup battery 62 and the reapplication of the backup battery 62. Of course, after the interruption of the battery backup voltage, all the data previously stored in the electronic key 10 would be lost and would have to be reprogrammed into the electronic key 10. While this loss in security might be unacceptable in some applications, this decreased security would be acceptable for certain other applications.

Thus, an electronic key has been described which has a range or set of valid commands which changes during the useful life of the electronic key from a first set or plurality of commands available when the electronic key is first fabricated to a fourth plurality or set of commands after the electronic key is being used by an end user and a countdown timer or down counter inside the electronic key indicates that a predetermined time period or a predetermined number of commands has been received by the electronic key.

Although the invention has been described in part by making detailed reference to certain specific embodiments, such detail is intended to be, and will be understood t.o be, instructional rather than restrictive. It will be appreciated by those skilled in the art that many variations can be made in the structure and mode of operation without departing from the spirit and scope of the invention, as disclosed in the teachings contained herein.

What is claimed is:

1. An electronic key, comprising:
   a fuse;
   a counter, connected to count accesses to said electronic key;
   control logic, including a latch which can be set by receipt of a predetermined external command;
   said control logic being configured so that
      at least some commands are accepted before said fuse has been blown but are not accepted after said fuse is blown;
      at least some other commands are accepted after said fuse has been blown and before said latch has been set, but are not accepted after said latch has been set; and
      at least some other commands are accepted after said latch has been set and before said counter counts off a predetermined number of accesses, but are not accepted after said counter has counted said predetermined number of accesses;
   wherein said latch cannot be reset after said fuse has been blown;
   and wherein said control logic and said counter are configured so that, if power is restored after said fuse has already been blown, said counter will immediately provide an output indicating that said predetermined number of accesses has already occurred.

2. The electronic key of claim 1, wherein said counter is a down counter, and does not begin to count until a valid command is first recognized, after said latch has been set.

3. The electronic key of claim 1, further comprising a secure memory, said control logic being connected to restrict access to said secure memory.

4. The electronic key of claim 1, further comprising a secure memory, and wherein at least some read operations can be performed on said secure memory after said counter has indicated that said predetermined number of accesses has already occurred.

5. The electronic key of claim 4, wherein said counter is a down counter, and is connected to count by days.

* * * * *